(12) United States Patent
Yamaji

(10) Patent No.: US 8,558,339 B1
(45) Date of Patent: Oct. 15, 2013

(54) PHOTO DIODE ARRAY

(71) Applicant: Kazuki Yamaji, Tokyo (JP)

(72) Inventor: Kazuki Yamaji, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 13/781,888

(22) Filed: Mar. 1, 2013

(51) Int. Cl.
H01L 31/107 (2006.01)

(52) U.S. Cl.
USPC .................... 257/438; 257/443; 257/E27.133

(58) Field of Classification Search
USPC .................................. 257/438, 443, E27.133
See application file for complete search history.

(56) References Cited

U.S. PATENT DOCUMENTS

| 6,100,570 A * | 8/2000 | Saito ............................ 257/446 |
| 6,844,607 B2 * | 1/2005 | Shirai et al. ................... 257/443 |
| 2010/0133637 A1 | 6/2010 | Yagyu et al. |
| 2010/0148216 A1 | 6/2010 | Nakaji et al. |
| 2012/0299141 A1 | 11/2012 | Sasahata et al. |

FOREIGN PATENT DOCUMENTS

| JP | 62-33482 A | 2/1987 |
| JP | 62-36858 A | 2/1987 |
| JP | 63-211686 A | 9/1988 |
| JP | 3-276769 A | 12/1991 |
| JP | 2000-101130 A | 4/2000 |
| JP | 2001-119004 A | 4/2001 |
| JP | 2002-100796 A | 4/2002 |
| JP | 2007-281144 A | 10/2007 |
| JP | 2007-281266 A | 10/2007 |
| JP | 2008-66584 A | 3/2008 |
| JP | 2009-38157 A | 2/2009 |
| JP | 2010-135360 A | 6/2010 |
| JP | 2010-147158 A | 7/2010 |
| JP | 2012-248655 A | 12/2012 |

* cited by examiner

*Primary Examiner* — Phat X Cao
(74) *Attorney, Agent, or Firm* — Leydig, Voit & Mayer, Ltd.

(57) ABSTRACT

A photo diode array includes: a substrate having a major face and a back face; photo diodes separated from each other and arrayed in parallel on the major face of the substrate and being linear in a plan view facing the major face of the substrate; a buried layer between the photo diodes and including a separating channel having a V-shape cross section; and a first metal mirror on an inclined face of the separating channel, reflecting incident light entering from the back face of the substrate, and leading the incident light to light-absorbing layers of the photo diodes. Band gap energy of the buried layer is wider than band gap energies of the light-absorbing layers.

5 Claims, 7 Drawing Sheets

INCIDENT
LIGHT

PHOTO DIODE ARRAY

BACKGROUND OF THE INVENTION

1. Field of the Invention

The present invention relates to a photo diode array that can realize a large aperture ratio.

2. Background Art

One of semiconductor light receiving elements is a photo diode. The photo diode is an element for detecting light, wherein a reverse bias voltage is applied to a p-n junction, and the electron-hole pairs (photo carriers) generated by the incident of light are taken out as a current. In addition, an avalanche photo diode is a light receiving element having a light absorbing layer and an avalanche multiplication layer can realize a high-sensitivity element in comparison with a photo diode, because the avalanche photo diode uses the multiplication of carriers by avalanche multiplication. A photo diode array has a plurality of photo diodes or avalanche photo diodes which are one-dimensionally or two-dimensionally arrayed in the plane, and are used as large-area optical sensors or the like.

As an avalanche photo diode, one has been proposed in which a concave portion is formed on a multiplication layer to provide a p-type diffusion region, causing avalanche brake down to occur at the center of the p-type diffusion region (for example, refer to Japanese Patent Laid-Open No. 62-033482). Thereby, edge breakdown caused at the end portion of the p-type diffusion region due to electric field concentration can be prevented. However, to form the concave portion, the process becomes complicated, and the variation of the element characteristics may be occurred. In addition, another diode has been proposed in which an electrode and a multiplication layer are made not to be neighbor, and an electric field relaxing layer is provided to inhibit edge breakdown (for example, refer to Japanese Patent Laid-Open No. 2010-135360).

A photo diode where comb-shaped shot key electrode is provided on a light-absorbing layer has been proposed (for example, refer to Japanese Patent Laid-Open No. 2000-101130). However, since light is received at a narrow depletion region formed in the vicinity of the electrode, and cannot be received outside of the depletion region and a region shaded by the electrode, the aperture ratio is small.

A photo diode wherein the p-type region is not selectively formed, but the epitaxial grown p-type layer is made to be mesa structure by etching has been proposed (for example, refer to Japanese Patent Laid-Open No. 2001-119004). However, the p-n joint interface is exposed on the side of the mesa, and the reliability has concerns. Further, since the electrodes are wired as a matrix, the chip area is enlarged.

A photo diode array providing a light shielding film to prevent the deterioration of characteristics due to stray light incident between arrays has been proposed (for example, refer to Japanese Patent Laid-Open No. 2002-100796). However, since currents are injected from the p-type electrodes placed on the end of the light-receiving region, electric fields are not evenly applied at a position located away from the electrodes due to a voltage drop, and the band may be deteriorated. Further, since respective elements are not electrically separated, electrical cross talk may be generated.

In a photo diode array of surface incident type wherein respective arrays are not electrically separated (for example, refer to Japanese Patent Laid-Open No. 2009-38157), electrical cross talk may occur. Further, slow responding component occurs by stray light incident between arrays, and there are concerns such as the deterioration of the bands or the lowering of S/N ratio. To prevent this, it has been proposed to prevent the signal light from entering other areas than the light receiving region by means of light shielding metal (for example, refer to Japanese Patent Laid-Open Nos. 2002-100796, 63-211686, and 3-276769), or to collect light into apertures by light shielding metal (for example, refer to Japanese Patent Laid-Open No. 2007-281144).

In the back face incident type photo diode array, since there is no electrode on the light incident surface, a high aperture ratio in comparison with the surface incident type can be obtained (for example, refer to Japanese Patent Laid-Open No. 2007-281266). However, a separating channel is formed for element separation, the area of the light receiving region decreases by the amount of the separating channel, lowering the aperture ratio. To prevent the lowering of the aperture ratio, the width of the separating channel needs to be narrower. However, it is difficult to reduce the width of the separating channel to a certain width or smaller and to put a coating of surface protecting film up to the bottom of the separating channel as the wide is narrower because of side etch, and as the width is narrow, the reliability is concerned. In addition, since the p-n joint interface exists on the sides of the separating channel formed by etching, there is a concern with respect to reliability.

On the contrary, the provision of a light reflecting layer on the slope of the separating channel having a V-shaped cross section has been proposed (for example, refer to Japanese Patent Laid-Open No. 62-36858). The light incident to the separating channel is reflected by the light reflecting layer, and guided to the light-absorbing layer. Therefore, since light incident to the separating channel can also contribute to the photocurrent, a high aperture ratio can be obtained.

Prior Art Document

Patent Document

SUMMARY OF THE INVENTION

In Patent Document 11, light is absorbed also by the p-HgCdTe layer provided in the separating channel region, and photo-carriers generate. Since the separating channel region is located away from the n-HgCdTe region electrically connected to an n-side electrode, the electric field applied to the separating channel region is weak. Therefore, the photo-carriers generated in the separating channel region are moved by diffusion, and appear as the constituent of a slow respond speed. Therefore, there is a concern of the band deteriorations. In addition, since the slow response components train and overlap, there is a concern of the deteriorations of S/N ratios.

In view of the above-described problems, an object of the present invention is to provide a photo diode array that can obtain a high aperture ratio and prevent the deterioration of the band and the deterioration of the S/N ratio.

According to the present invention, a photo diode array includes: a substrate having a major face and a back face; a plurality of photo diodes separated from each other and arrayed in parallel on the major face of the substrate and being linear in a plan view facing the major face of the substrate; a buried layer burying between the plurality of photo diodes and including a separating channel having a V-shape cross section; and a first metal mirror on a incline of the separating channel, reflecting an incident light entering from the back face of the substrate, and leading the incident light to light-absorbing layers of the plurality of photo diodes. A band gap of the buried layer is wider than band gaps of the light-absorbing layers.

The present invention makes it possible to obtain a high aperture ratio and prevent the deterioration of the band and the deterioration of the S/N ratio.

Other and further objects, features and advantages of the invention will appear more fully from the following description.

DETAILED DESCRIPTION OF THE PREFERRED EMBODIMENTS

A photo diode array according to the embodiments of the present invention will be described with reference to the drawings. The same components will be denoted by the same symbols, and the repeated description thereof may be omitted.

First Embodiment

Figure 1:
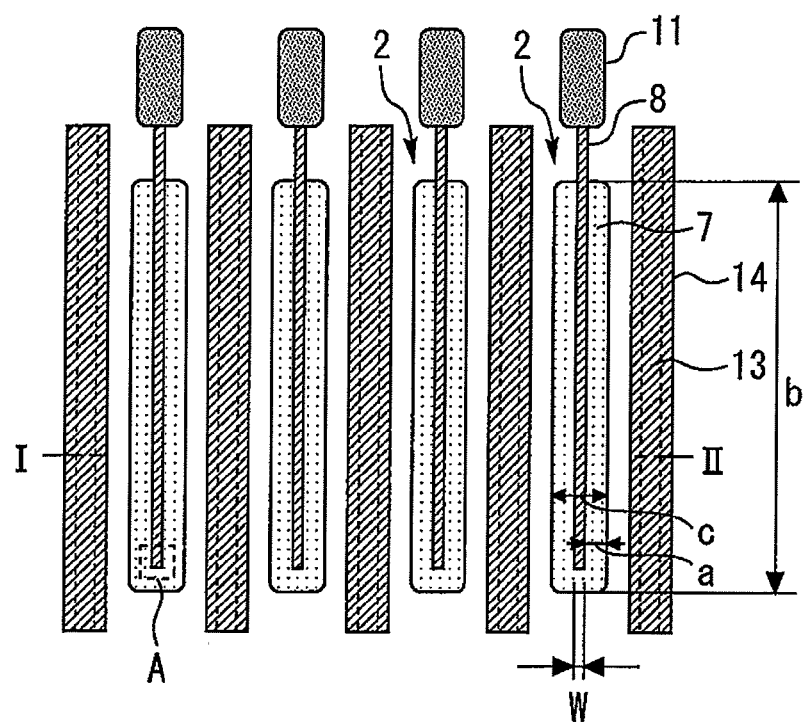
FIG. 1 is a plan view showing a photo diode array according to the first embodiment of the present invention.
Figure 2:
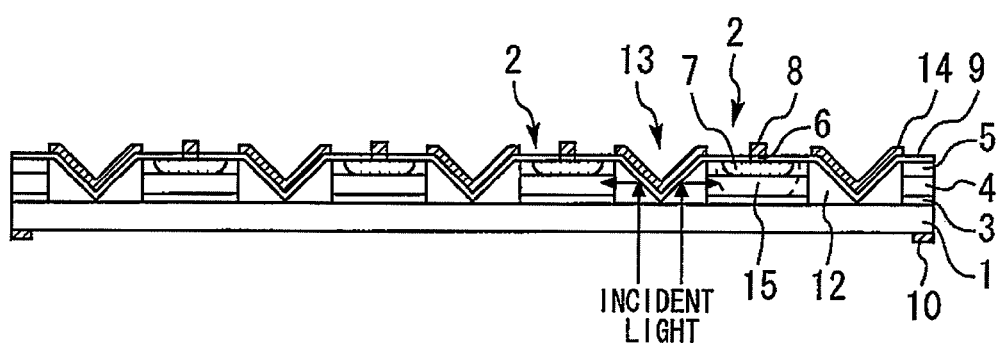
FIG. 2 is a sectional view taken along the line I-II in FIG. 1.
Figure 3:
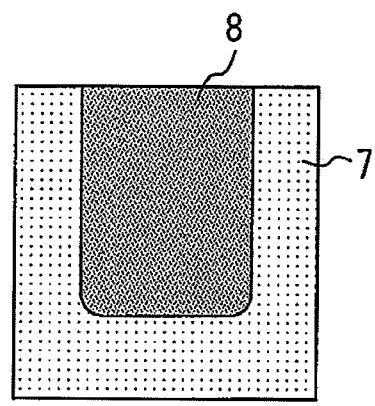
FIG. 3 is an enlarged plan view of the region A in FIG. 1.

FIG. 1 is a plan view showing a photo diode array according to the first embodiment of the present invention. FIG. 2 is a sectional view taken along the line I-II in FIG. 1. FIG. 3 is an enlarged plan view of the region A in FIG. 1. On the major face of the n-type InP substrate 1, although a plurality of linear photo diodes 2 in a plan view facing the major face of the n-type InP substrate 1 are separated from each other and are arrayed in parallel.

On the major face of the n-type InP substrate 1 in the respective photo diodes 2, the n-type InP buffer layer 3, the light-absorbing layer 4 of un-doped InGaAs of a thickness of 2 μm to 3 μm, the un-doped InP window layer 5 of a thickness of 1 μm to 2 μm, and an InGaAs contact layer 6 are laminated in this order. In a part of the un-doped InP window layer 5, a p-type impurity region 7 is provided. The impurity concentration of the n-type InP substrate 1 is approximately $5 \times 10^{18}$ cm$^{-3}$, and the impurity concentration of the p-type impurity region 7 is $1 \times 10^{19}$ cm$^{-3}$ to $1 \times 10^{20}$ cm$^{-3}$.

The linear p-side electrode 8 formed of Ti/Au or the like is provided on the InGaAs contact layer 6, and is electrically connected to the p-type impurity region 7 via the InGaAs contact layer 6. The surface protecting film 9 formed of SiN (silicon nitride) coats the un-doped InP window layer 5. The n-side electrode 10 formed of AuGe/Au is electrically connected to the back face of the n-type InP substrate 1.

The width w of the p-side electrode 8 is 5 μM. The distance "a" between the p-side electrode 8 and the outer end of the p-type impurity region 7 is 14.5 μM. The length "b" of the p-type impurity region 7 is longer than the width "c" of the p-type impurity region 7. The shape of the p-type impurity region 7 is rectangular or corner-rounded rectangular when viewed plenary. The p-side electrode 8 is extended to the long-side direction of the p-type impurity region 7. The p-side electrode 8 is connected to the electrode pad 11 provided on the region other than the p-type impurity region 7 of the un-doped InP window layer 5. The connected portion of the p-side electrode 8 and the electrode pad 11 crosses the short side of the p-type impurity region 7. The p-side electrode 8 has no corners and rounded.

The buried layer 12 buries between the plurality of photo diodes 2. In the buried layer 12, a separating channel 13 having a V-shape cross section is provided. Metal mirrors 14 are provided on respective inclines of the separating channels 13. The material for the metal mirrors 14 is Ti, Au, Ta, or the lamination thereof, etc.

The metal mirror 14 reflects the incident light entering from the back face of the n-type InP substrate 1 and leads it to the light-absorbing layers 4 of the plurality of photo diodes 2. The incident light is light having, for example, the wave length 2 of 1.55 μM. The buried layer 12 is formed of a semi-insulating InP doping Fe or Ru, and the band gap of the buried layer 12 is wider than the band gap of the light-absorbing layer 4.

Next, the method for fabricating the photo diode array according to the first embodiment of the present invention will be briefly explained. Firstly, on the n-type InP substrate 1, an n-type InP buffer layer 3, an un-doped InGaAs light-absorbing layer 4, an un-doped InP window layer 5, and an InGaAs contact layer 6 are epitaxially grown in sequence using MOCVD (Metal Organic Chemical Vapor Deposition) method or the like.

Next, Zn is diffused to the depth reaching to the light-absorbing layer 4 on a part of the un-doped InP window layer 5 to form a p-type impurity region 7. As the diffusing method, gas-phase diffusion, heat diffusion or the like using a mask or the like is used. For the heat diffusion method, for example, a SiN film (not shown) is formed on the un-doped InP window layer 5, and an aperture is formed in the SiN film on the region where the p-type impurity region 7 is formed. A diffusion source such as a ZnO film (not shown) is formed on the aperture and the SiN film, and a heat treatment using the SiN film as a mask is performed for a specified time. In place of Zn, an impurity such as Cd or Be can be used.

Next, after the SiN film and the ZnO film are removed, the InGaAs contact layer 6 is formed. Then, after forming the vertical mesa by wet or dry etching, a semi-insulating semiconductor material, the band gap of which is wider than that of the light-absorbing layer 4, is buried and grown to fill the mesa portion to form the buried layer 12.

Next, in the buried layer 12, a separating channel 13 to electrically separate the respective photo diodes 2 is formed. At this time, by using the etching solution wherein the etching rate in the direction parallel to the major face of the n-type InP substrate 1 exceeds the etching rate in the direction perpendicular to the major face, the cross-section of the separating channel 13 exhibits V-shape.

Next, using a plasma CVD method or the like, a surface protecting film 9 that also functions as a reflection preventing film is formed on the surface of the un-doped InP window layer 5. By the combination of a photolithography technique with etching using fluoric acid or the like, an aperture is formed in the surface protecting film 9 at the location for forming the p-side electrode 8. Then, a photoresist (not shown) is provided on the surface protecting film 9, and is patterned to form an aperture in the photoresist above the aperture of the surface protecting film 9 and in the region where the metal mirrors 14 is formed.

Next, after forming a Ti/Au film by electron beam (EB) vaporizing, the unrequired part of the Ti/Au film is lift off together with the photoresist to form the p-side electrode 8 and a metal mirror 14. At this time, the electrode pad 11 connected to the p-side electrode 8 is simultaneously formed on the surface protecting film 9. Thereafter, the back face of the n-type InP substrate 1 is polished to form the n-side electrode 10. By the above-described process, the photo diode array according to the first embodiment is fabricated.

Next, the operation of the photo diode array according to the first embodiment will be explained. When a bias voltage is applied from the exterior so that the n-side electrode 10 is plus and the p-side electrode 8 is minus, a depletion layer 15 is formed. In this state, an incident light entering from the back face of the n-type InP substrate 1 transmits the n-type InP substrate 1 and is absorbed in the light-absorbing layer 4 to generate the electron-hole pair (photo carrier). By the electric field in the depletion layer 15, and since electrons move toward the n-side electrode 10 and holes move toward the p-side electrode 8, a current flows. Thereby, incident light can be detected as a current.

Figure 4:
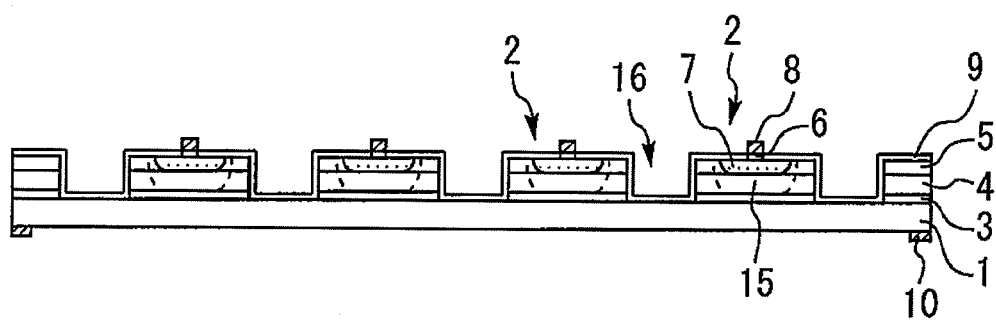
FIG. 4 is a sectional view showing a photo diode array according to the first comparative example.

Next, the effects of the first embodiment in comparison with the effects of the first and the second comparative example will be explained. FIG. 4 is a sectional view showing a photo diode array according to the first comparative example. In the first comparative example, the respective photo diodes 2 are separated by separating channels 16 for preventing the crosstalk between the photo diodes 2. Neither buried layers 12 nor the metal mirrors 14 are provided in the separating channels 16. For this reason, the light incident on the separating channel 16 is not absorbed in the light-absorbing layer 4, and cannot contribute to the photocurrent. Therefore, the aperture ratio is lowered for the width of the separating channel 16.

In the first embodiment, on the contrary, light incident on the separating channel 13 is reflected by the first metal mirror 14 formed in inclines in a V-shape, and led into the light-absorbing layer 4. Therefore, since the light incident on the separating channel 13 can also contribute to the photocurrent, a high aperture ratio can be obtained.

Figure 5:
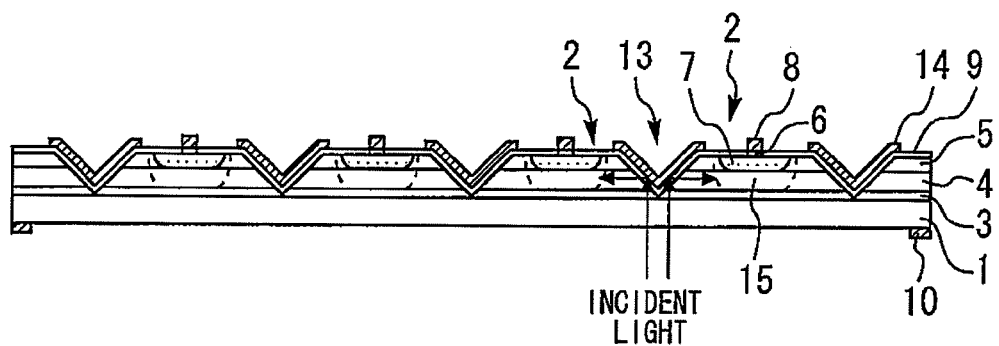
FIG. 5 is a sectional view showing a photo diode array according to the second comparative example.

FIG. 5 is a sectional view showing a photo diode array according to the second comparative example. In the second comparative example, the respective photo diodes 2 are separated by the separating channels 13, and the metal mirrors 14 are provided on the inclines of the separating channels 13. Therefore, since the incident light into the separating channels 13 can also contribute to the photocurrent, a high aperture ratio can be obtained. However, in the second comparative example, the light-absorbing layers 4 are provided up to the separating channel regions. Since the separating channel regions are located away from the p-type impurity regions 7, the electric field applied to the separating channel regions is weak. Therefore, the photo carriers generated in the separating channel regions move by diffusion, and appear as components of slow response speed. For this reason, the bands may be deteriorated. In addition, the slow responding components are trained and overlapped, the S/N ratio may be deteriorated.

On the contrary, in the first embodiment, the separating channel regions are buried by the buried layer 12, and the band gap of the buried layer 12 is wider than the band gap of the light-absorbing layer 4. For this reason, the incident light reflected by the metal mirrors 14 does not contribute the generation of the photo carriers until it reaches the light-absorbing layer 4, and the generation of the photo carriers does not occur in the separating channel region. Therefore, since the occurrence of the slow responding components can be prevented, the deterioration of the band and the deterioration of the S/N ratio can be prevented.

In addition, by using the materials having a wide band gap as the buried layer 12, since the leak current via mid gap level at the interface between the surface protecting film 9 and the buried layer 12 can be lowered, the S/N ratio and reliability can be improved.

Also, it is preferred that the buried layer 12 is formed of a semi-insulating semiconductor. Thereby, since the separating channel region has high resistance, the region where the current flows is limited, and leak current can be reduced.

Furthermore, it is preferable that the width of the InGaAs contact layer 6 is widened, and the distance between the InGaAs contact layer 6 and the outer end of the p-type impurity region 7 is, for example, 1 to 5 μm. Thereby, since the resistance between the p-type impurity region 7 and the p-side electrode 8 is lowered, the serial resistance of the photo diode is lowered, and the band can be improved.

In addition, it is preferable that the impurity concentration in the p-type impurity region 7 is $1\times10^{19}$ cm$^{-3}$ or more. Thereby, since the resistance of the p-type impurity region 7 is lowered, a uniform electric field can be applied to the p-type impurity region 7. As a result, the in-plane unevenness of the band or the multiplication can be inhibited.

Second Embodiment

Figure 6:
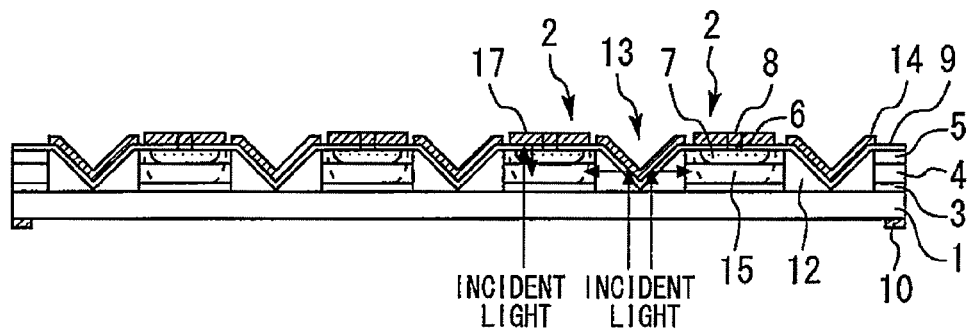
FIG. 6 is a sectional view showing the photo diode array according to the second embodiment of the present invention.

FIG. 6 is a sectional view showing the photo diode array according to the second embodiment of the present invention. Metal mirrors 17 are provided on the respective upper surfaces of the plurality of photo diodes 2. Other configurations and the fabricating method are identical to those of the first embodiment.

The metal mirrors 17 reflect the incident light passed through the light-absorbing layer 4 and leads it to the light-absorbing layer 4 again. Therefore, light receiving sensitivity can be improved. In addition, since the light-absorbing layer 4 can be thinned if the light receiving sensitivity is made constant by the effect of the metal mirrors 17, the band can be improved.

Third Embodiment

Figure 7:
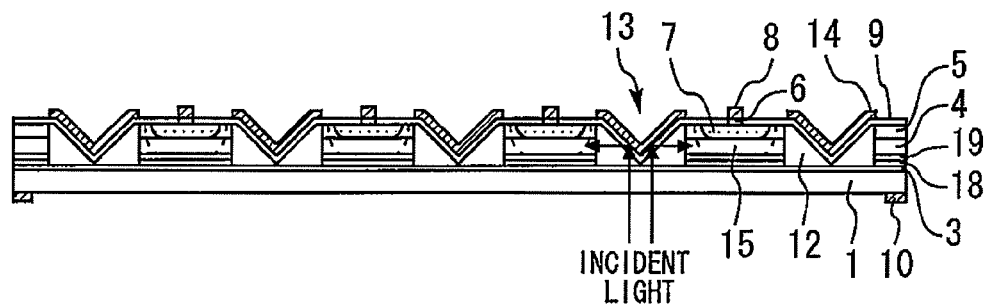
FIG. 7 is a sectional view showing the photo diode array according to the third embodiment of the present invention.

FIG. 7 is a sectional view showing the photo diode array according to the third embodiment of the present invention. Between an n-type InP buffer layer 3 and a light-absorbing layer 4, an avalanche multiplication layer 18 composed of un-doped AlInAs having the thickness of 0.15 μm to 0.4 μm and a p-type InP electric field relaxing layer 19 having the thickness of 0.03 μm to 0.06 μm are provided. The impurity concentration of the p-type InP electric field relaxing layer 19 is $0.5\times10^{18}$ cm$^{-3}$ to $1\times10^{18}$ cm$^{-3}$. The Respective photo diodes 2 are separated by the separating channel 13 formed from the surface of the epitaxial-grown layer to the depth penetrating the avalanche multiplication layer 18. The other configuration and the fabricating method are identical to the configuration and the fabricating method in the first embodiment.

Next, the operation of the photo diode array according to the second embodiment will be described. When a bias voltage is applied from the exterior so that the n-side electrode 10 is plus and the p-side electrode 8 is minus, a depletion layer 15 is formed. Under this condition, the incident light entering from the back face of the n-type InP substrate 1 penetrates the n-type InP substrate 1, the n-type InP buffer layer 3, the avalanche multiplication layer 18, and the p-type InP electric field relaxing layer 19, and absorbed at the light-absorbing layer 4 to generate electron-hole pairs. By the electric field in the depletion layer 15, electrons move toward the n-side electrode 10, and holes move toward the p-side electrode 8. When the bias voltage is sufficiently high, in the avalanche multiplication layer 18, electrons trigger collisional ionization and form new electron-hole pairs, and the newly formed electrons and holes create positive feedback triggering further collisional ionization. Thereby, avalanche multiplication wherein electrons and holes are multiplied like avalanche occurs and carriers are multiplied. As a result, the system operates as high-sensitivity light detecting element.

As described, since a plurality of photo diodes 2 are avalanche photo diodes, sensitivity can be improved in comparison with the first embodiment. In addition, by providing the p-type InP electric field relaxing layer 19, edge breakdown can be prevented, and uniform light receiving characteristics can be obtained. However, in place of the p-type InP electric field relaxing layer 19, an AlInAs electric field relaxing layer can also be used.

In addition, by making the p-type impurity region 7 to be corner-rounded rectangular for eliminating sharp corners, the electric field concentration at corner portions of the p-type impurity region 7 can be avoided. Alternately, similarly to the second embodiment, a metal mirror 17 can be provided on the upper surface of the plurality of photo diode 2.

Fourth Embodiment

Figure 8:
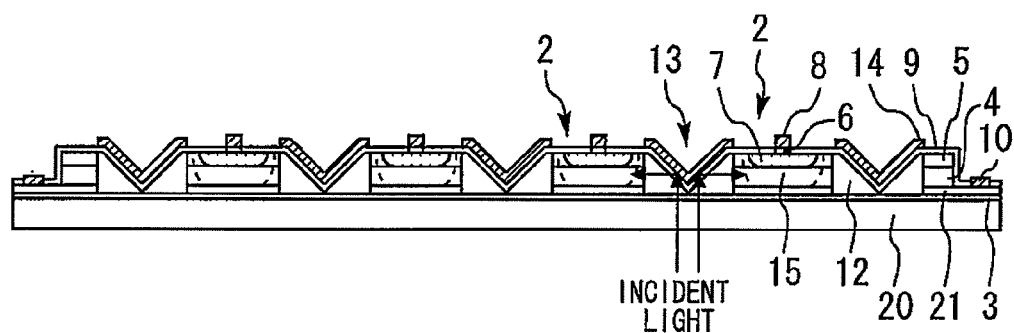
FIG. 8 is a sectional view showing a photo diode array according to the fourth embodiment of the present invention.

FIG. 8 is a sectional view showing a photo diode array according to the fourth embodiment of the present invention. In place of the n-type InP substrate 1 in the first embodiment, a semi-insulating InP substrate 20 doped with Fe or Ru is used, and an n-type InP contact layer 21 is inserted between the n-type InP buffer layer 3 and the light-absorbing layer 4. The n-side electrode 10 is connected to the n-type InP contact layer 21. Other constitution and the fabricating method are identical to the constitution and the fabricating method in the first embodiment. Since the light absorption can be reduced by using such a semi-insulating InP substrate 20, the light intensity incident to the light-absorbing layer 4 increases, and the light receiving sensitivity can be improved.

Fifth Embodiment

Figure 9:
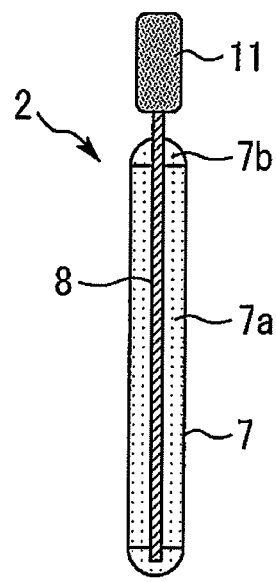
FIG. 9 is a plan view showing a photo diode array according to the fifth embodiment of the present invention.

FIG. 9 is a plan view showing a photo diode array according to the fifth embodiment of the present invention. However, only one respective photo diode 2 is selected and shown. The p-type impurity region 7 has a rectangular region 7a, which is rectangular in the planner view and two semi-circular regions 7b each bonded to the two shorter sides of the rectangular region 7a. As shown, by bonding the semi-circular region 7b to the rectangular region 7a to eliminate corners, the electric field concentration in the corners of the p-type impurity region 7 can be avoided, and uniform light-receiving characteristics can be obtained.

Sixth Embodiment

Figure 10:
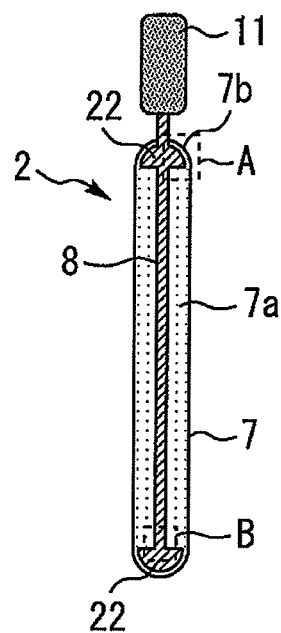
FIG. 10 is a plan view showing a photo diode array according to the sixth embodiment of the present invention.

FIG. 10 is a plan view showing a photo diode array according to the sixth embodiment of the present invention. However, only one respective photo diode 2 is selected and shown. The semicircular electrode 22 is placed on the semi-circular p-type impurity region 7b. The semicircular electrode 22 is connected to the p-side electrode 8. The most of other than the end portion of the semi-circular p-type impurity region 7b is shaded by the semicircular electrode 22, and the center portion of the rectangular region 7a is also shaded by the p-side electrode 8. Thereby, two rectangular impurity regions in which the band area and the band region and multiplying rates are even in the plane can be realized.

Figure 11:
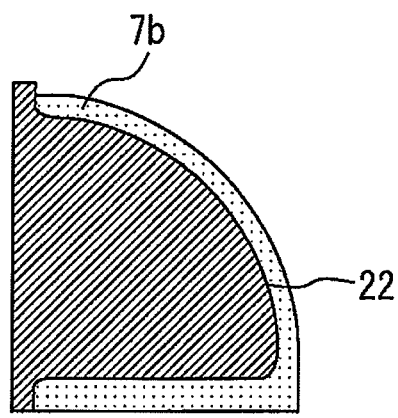
FIG. 11 is an enlarged plan view of the region A in FIG. 10.
Figure 12:
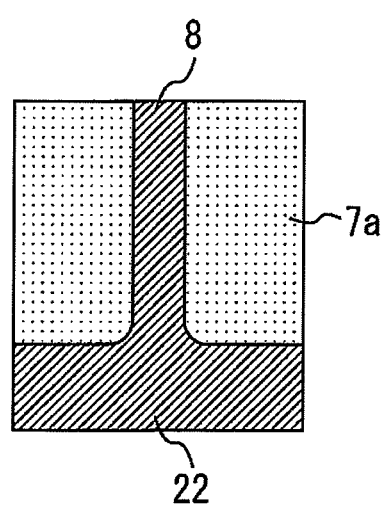
FIG. 12 is an enlarged plan view of the region B in FIG. 10.

FIG. 11 is an enlarged plan view of the region A in FIG. 10. FIG. 12 is an enlarged plan view of the region B in FIG. 10. The p-side electrode 8 and the semicircular electrode 22 have no corners. Thereby, the concentration of the electric field in the corners of the p-side electrode 8 and the semicircular electrode 22 is avoided, and edge breakdown or uneven light receiving characteristics can be avoided.

Seventh Embodiment

Figure 13:
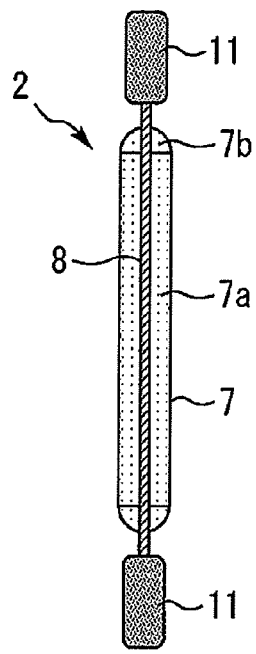
FIG. 13 is a plan view showing the photo diode array according to the seventh embodiment of the present invention.

FIG. 13 is a plan view showing the photo diode array according to the seventh embodiment of the present invention. However, only one respective photo diode 2 is selected and shown. The p-side electrode 8 is connected to two different electrode pads 11. The electrode pad 11 is placed on the region other than the p-type impurity region 7 in the un-doped InP window layer 5. The places where respective connecting portions of the p-side electrode 8 and two electrode pads 11 cross on the p-type impurity region 7 are only two. As described, by injecting the current from two electrode pads 11, the electric field in the plane can be even, and the even multiplication can be obtained.

Eighth Embodiment

Figure 14:
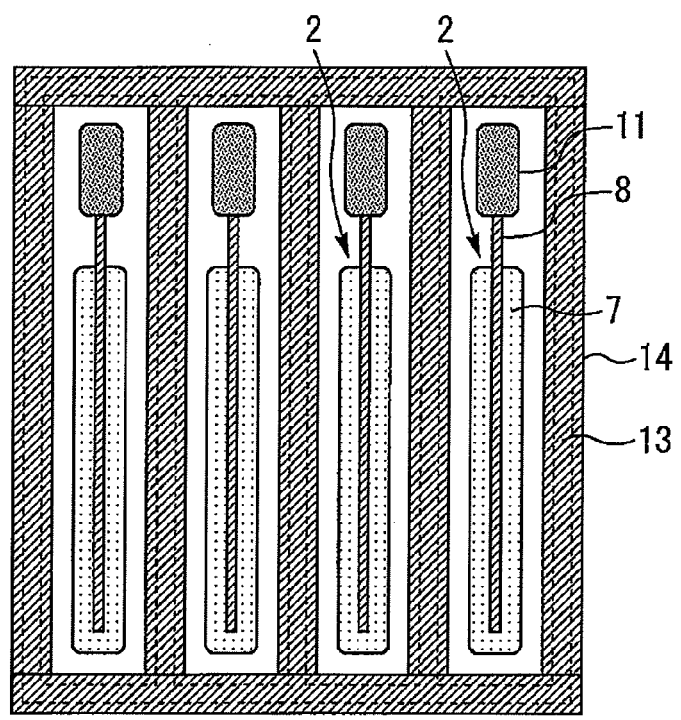
FIG. 14 is a plan view showing a photo diode array according to the eighth embodiment of the present invention.

FIG. 14 is a plan view showing a photo diode array according to the eighth embodiment of the present invention. The separating channel 13 and the metal mirror 14 are provided so as to surround all of the circumference of respective photo diodes 2. Thereby, the electric cross talks between photo diodes 2 can be further lowered.

Ninth Embodiment

Figure 15:
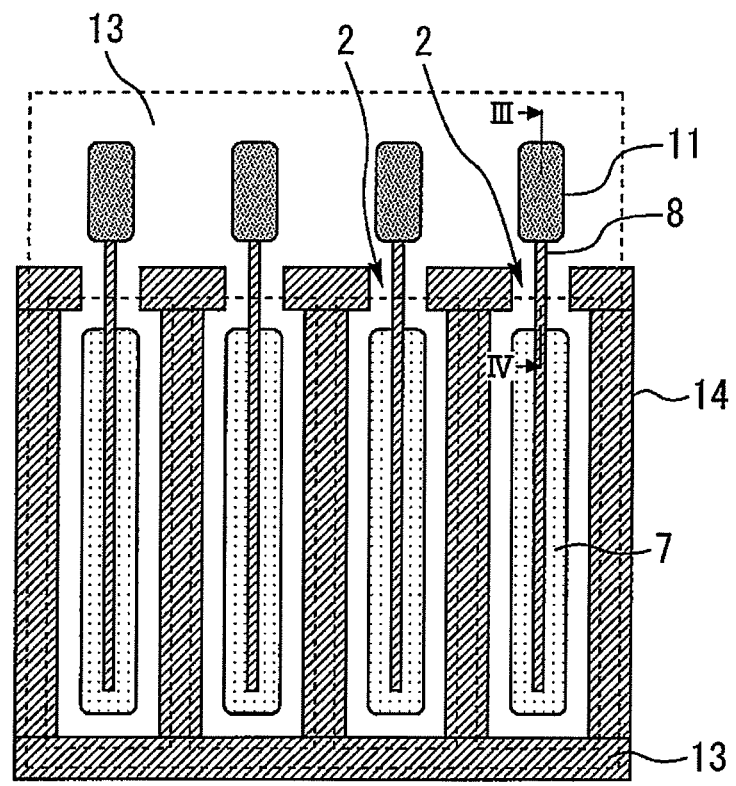
FIG. 15 is a plan view showing a photo diode array according to the ninth embodiment of the present invention.
Figure 16:
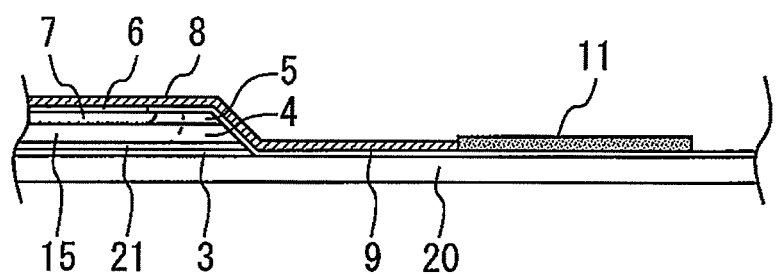
FIG. 16 is a sectional view taken along the line III-IV in FIG. 15.

FIG. 15 is a plan view showing a photo diode array according to the ninth embodiment of the present invention. FIG. 16 is a sectional view taken along the line III-IV in FIG. 15. The ninth embodiment is an embodiment when the separating channel 13 in the fourth embodiment is formed by etching, the etching is performed to the region to provide the electrode pad 11.

In the fourth embodiment, in the electrode pad 11 and the n-type InP contact layer 21, the volume proportional to the area of the electrode pad 11 across the light-absorbing layer 4 and the un-doped InP window layer 5 is configured. In contrast to this, according to the ninth embodiment, since the volume of the electrode pad 11 can be eliminated, the element volume can be lowered, and the bandwidth can be improved.

Obviously many modifications and variations of the present invention are possible in the light of the above teachings. It is therefore to be understood that within the scope of the appended claims the invention may be practiced otherwise than as specifically described.

The entire disclosure of Japanese Patent Application No. 2012-136073, filed on Jun. 15, 2012, including specification, claims, drawings, and summary, on which the Convention priority of the present application is based, is incorporated herein by reference in its entirety.

What is claimed is:

1. A photo diode array comprising:
   a substrate having a major face and a back face;
   a plurality of photo diodes separated from each other and arrayed in parallel on the major face of the substrate and being linear in a plan viewer perpendicular to the major face of the substrate;
   a buried layer located between the plurality of photo diodes and including a separating channel having, in cross-section, a V-shape with inclined faces; and
   a first metal mirror on one of the inclined faces of the separating channel, reflecting incident light entering from the back face of the substrate, and leading the incident light to light-absorbing layers of the plurality of photo diodes, wherein band gap energy of the buried layer is wider than band gap energies of the light-absorbing layers.

2. The photo diode array according to claim 1, wherein the buried layer is a semi-insulating semiconductor.

3. The photo diode array according to claim 1, further comprising second metal mirrors on respective upper surfaces of the plurality of photo diodes, reflecting the incident light, and leading the incident light to the light-absorbing layers.

4. The photo diode array according to claim 1, wherein the plurality of photo diodes are avalanche photo diodes.

5. The photo diode array according to claim 1, wherein the substrate is a semi-insulating substrate.

* * * * *